(12) United States Patent
Morton

(10) Patent No.: US 7,003,012 B2
(45) Date of Patent: *Feb. 21, 2006

(54) DISCHARGE LASER WITH POROUS INSULATING LAYER COVERING ANODE DISCHARGE SURFACE

(75) Inventor: Richard G. Morton, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 158 days.

This patent is subject to a terminal disclaimer.

(21) Appl. No.: 10/684,016

(22) Filed: Oct. 10, 2003

(65) Prior Publication Data
US 2005/0018737 A1 Jan. 27, 2005

Related U.S. Application Data

(60) Division of application No. 09/953,026, filed on Sep. 13, 2001, now Pat. No. 6,711,202, which is a continuation-in-part of application No. 09/776,044, filed on Feb. 1, 2001, now Pat. No. 6,584,132, which is a continuation-in-part of application No. 09/768,753, filed on Jan. 23, 2001, now Pat. No. 6,414,979, which is a continuation-in-part of application No. 09/742,485, filed on Dec. 20, 2000, now abandoned, which is a continuation-in-part of application No. 09/703,697, filed on Nov. 1, 2000, now Pat. No. 6,363,094, which is a continuation-in-part of application No. 09/590,961, filed on Jun. 9, 2000, now Pat. No. 6,466,602, which is a continuation-in-part of application No. 09/590,958, filed on Jun. 9, 2000, now Pat. No. 6,560,263.

(51) Int. Cl.
*H01S 3/223* (2006.01)
*H01S 3/097* (2006.01)

(52) U.S. Cl. .......................... 372/87; 372/55

(58) Field of Classification Search .................. 372/55, 372/87
See application file for complete search history.

(56) References Cited

U.S. PATENT DOCUMENTS 3,828,277 A * 8/1974 Otto et al. .................... 372/82
4,152,672 A * 5/1979 Hundstad ..................... 372/33

(Continued)

FOREIGN PATENT DOCUMENTS

JP 2631607 7/1997

OTHER PUBLICATIONS

Nguyen, Thinh, et al., "Diffusion Bonding—An Advanced Material Process for Aerospace Technology", http://www-.vacets.org/vtic97//ttnguyen.htm.

*Primary Examiner*—Minsun Oh Harvey
*Assistant Examiner*—Phillip Nguyen
(74) *Attorney, Agent, or Firm*—William Cray

(57) ABSTRACT

A gas discharge laser having an elongated cathode and an elongated anode with a porous insulating layer covering the anode discharge surface. A pulse power system provides electrical pulses at rates of at least 1 KHz. A blower circulates laser gas between the electrodes at speeds of at least 5 m/s and a heat exchanger is provided to remove heat produced by the blower and the discharges. In preferred embodiments at least a portion of the anode is comprised of lead, and fluorine ion sputtering of the anode surface creates the insulating layer (over the discharge surface of the anode) comprised in large part of lead fluoride. In a particular preferred embodiment the anode is fabricated in two parts, a first part having the general shape of a prior art anode with a trench shaped cavity at the top and a second part comprised of lead rich brass and disposed in the trench shape cavity.

28 Claims, 10 Drawing Sheets

U.S. PATENT DOCUMENTS

| | | | |
|---|---|---|---|
| 4,245,194 A | 1/1981 | Fahlen et al. | 331/94.5 |
| 4,414,488 A | 11/1983 | Hoffmann et al. | 315/39 |
| 4,546,482 A * | 10/1985 | Bagaglia et al. | 372/86 |
| 4,547,886 A * | 10/1985 | Kaminski et al. | 372/59 |
| 4,686,682 A | 8/1987 | Haruta et al. | 372/87 |
| 4,703,490 A | 10/1987 | Brumme et al. | 372/86 |
| 4,774,714 A | 9/1988 | Javan | 372/109 |
| 4,800,567 A * | 1/1989 | Karube | 372/87 |
| 4,876,693 A | 10/1989 | Lucero et al. | 372/82 |
| 4,959,840 A | 9/1990 | Akins et al. | 372/57 |
| 5,070,513 A | 12/1991 | Letardi | 372/83 |
| 5,153,892 A * | 10/1992 | Kawakubo et al. | 372/87 |
| 5,247,534 A | 9/1993 | Muller-Horsche | 372/58 |
| 5,359,620 A | 10/1994 | Akins | 372/58 |
| 5,535,233 A | 7/1996 | Mizoguchi et al. | 372/87 |
| 5,557,629 A | 9/1996 | Mizoguchi et al. | 372/87 |
| 5,586,134 A | 12/1996 | Das et al. | 372/38 |
| 5,771,258 A | 6/1998 | Morton et al. | 372/57 |
| 5,771,259 A * | 6/1998 | Dvorkin | 372/87 |
| 5,898,723 A * | 4/1999 | Le Guyadec et al. | 372/56 |
| 6,038,055 A | 3/2000 | Hansch et al. | 359/279 |
| 6,711,202 B1 * | 3/2004 | Morton | 372/87 |
| 2003/0012234 A1 | 1/2003 | Watson et al. | 372/25 |
| 2003/0031216 A1 | 2/2003 | Fallon et al. | 372/29.01 |
| 2003/0138019 A1 | 7/2003 | Rylov et al. | 372/58 |
| 2004/0022292 A1* | 2/2004 | Morton et al. | 372/55 |
| 2005/0018737 A1* | 1/2005 | Morton | 372/55 |

* cited by examiner

DISCHARGE LASER WITH POROUS INSULATING LAYER COVERING ANODE DISCHARGE SURFACE

This invention relates to electric discharge lasers and in particular to such lasers having chambers with long life electrodes. This application is a divisional of U.S. Ser. No. 09/953,026, filed Sep. 13, 2001 now U.S. Pat. No. 6,711,202, which is a continuation-in-part of U.S. Ser. No. 09/590,958, filed Jun. 9, 2000, now issued as U.S. Pat. No. 6,560,263, U.S. Ser. No. 09/590,961, filed Jun. 9, 2000, now issued as U.S. Pat. No. 6,466,602, U.S. Ser. No. 09/703,697, filed Nov. 1, 2000, now issued as U.S. Pat. No. 6,363,094, U.S. Ser. No. 09/742,485; filed Dec. 20, 2000 abn, U.S. Ser. No. 09/768,753, filed Jan. 23, 2001, now issued as U.S. Pat. No. 6,414,979, and U.S. Ser. No. 09/776,044, filed Feb. 1, 2001, now issued as U.S. Pat. No. 6,584,132.

BACKGROUND OF THE INVENTION

The principal components of a prior art KrF excimer laser chambers are shown in FIG. 1. This chamber is a part of a laser system used as a light source for integrated circuit lithography. These components include a chamber housing 2. The housing contains two electrodes 84 and 83 each about 50 cm long and spaced apart by about 20 mm, a blower 4 for circulating a laser gas between the electrodes at velocities fast enough to clear (from a discharge region between the two electrodes) debris from one pulse prior to the next succeeding pulse at a pulse repetition rate in the range of 1000 Hz or greater, and a water cooled finned heat exchanger 6 for removing heat added to the laser gas by the fan and by electric discharges between the electrodes. The word "debris" is used here to define any physical condition of the gas after a laser pulse which is different from the condition of the gas prior to said pulse. The chamber may also include baffles and vanes for improving the aerodynamic geometry of the chamber. The laser gas is comprised of a mixture of about 0.1 percent fluorine, about 1.0 percent krypton and the rest neon. Each pulse is produced by applying a very high voltage potential across the electrodes with a pulse power supply 8 which causes a discharge between the electrodes lasting about 30 nanoseconds to produce a gain region about 20 mm high, 3 mm wide and 500 mm long. The discharge deposits about 2.5 J of energy into the gain region. As shown in FIG. 2, lasing is produced in a resonant cavity, defined by an output coupler 2A and a grating based line narrowing unit (called a line narrowing package or LNP, shown disproportionately large) 2B comprising a three prism beam expander, a tuning mirror and a grating disposed in a Littrow configuration. The energy of the output pulse 3 in this prior art KrF lithography laser is typically about 10 mJ.

There are many industrial applications of electric discharge lasers. One important use is as the light source for integrated circuit lithography machines. One such laser light source is the line narrowed KrF laser described above which produces a narrow band pulsed ultraviolet light beam at about 248 nm. These lasers typically operate in bursts of pulses at pulse rates of about 1000 to 4000 Hz. Each burst consists of a number of pulses, for example, about 80 pulses, one burst illuminating a single die section on a wafer with the bursts separated by off times of a fraction of a second while the lithography machine shifts the illumination between die sections. There is another off time of a few seconds when a new wafer is loaded. Therefore, in production, for example, a 2000 Hz, KrF excimer laser may operate at a duty factor of about 30 percent. The operation is 24 hours per day, seven days per week, 52 weeks per year. A laser operating at 2000 Hz "around the clock" at a 30 percent duty factor will accumulate more than 1.5 billion pulses per month. Any disruption of production can be extremely expensive. For these reasons, prior art excimer lasers designed for the lithography industry are modular so that maintenance down time is minimized.

Maintaining high quality of the laser beam produced by these lasers is very important because the lithography systems in which these laser light sources are used are currently required to produce integrated circuits with features smaller than 0.25 microns and feature sizes get smaller each year. As a result the specifications placed on the laser beam limit the variation in individual pulse energy, the variation of the integrated energy of series of pulses, the variation of the laser wavelength and the magnitude of the bandwidth of the laser beam.

Typical operation of electric discharge lasers such as that depicted in FIG. 1 causes electrode erosion. Erosion of these electrodes affects the shape of the discharge which in turn affects the quality of the output beam as well as the laser efficiency. Electrode designs have been proposed which are intended to minimize the effects of erosion by providing on the electrode a protruding part having the same width as the discharge. Some examples are described in Japanese Patent No. 2631607. These designs, however, produce adverse effects on gas flow. In these gas discharge lasers, it is very important that virtually all effects of each pulse be blown out of the discharge region prior to the next pulse.

Another discharge laser, very similar to the KrF laser is the argon fluorine (ArF) laser. In this laser the gas is a mixture primarily of argon fluorine and neon, and the wavelength of the output beam is in the range of about 193 nm. These ArF lasers are just now being used to a significant extend for integrated circuit fabrication, but the use of these lasers is expected to grow rapidly. Still another discharge laser expected to be used extensively in the future for integrated circuit fabrication is the $F_2$ laser where the gas is $F_2$ and a buffer gas could be neon or helium or a combination of neon and helium.

What is needed is a gas discharge laser having electrodes which do not adversely affect gas flow and can withstand many billions of pulses without eroding sufficiently to adversely affect the laser beam quality.

SUMMARY OF THE INVENTION

The present invention provides a gas discharge laser having an elongated cathode and an elongated anode with a porous insulating layer covering the anode discharge surface. A pulse power system provides electrical pulses at rates of at least 1 KHz. A blower circulates laser gas between the electrodes at speeds of at least 5 m/s and a heat exchanger is provided to remove heat produced by the blower and the discharges. In preferred embodiments at least a portion of the anode is comprised of lead, and fluorine ion sputtering of the anode surface creates the insulating layer (over the discharge surface of the anode) comprised in large part of lead fluoride. In a particular preferred embodiment the anode is fabricated in two parts, a first part having the general shape of a prior art anode with a trench shaped cavity at the top. This part is comprised of brass comprised of less than 1% lead. A second part comprised of brass having a lead content of greater than 3% is soldered into the trench and protrudes above the surface by about 0.2 millimeter. When the anode is installed in the laser and is subjected to pulse discharges in a fluorine containing laser gas environment an insulating layer, comprising porous lead fluoride, forms on the surface of the second part protecting it from significant erosion. Applicants' computer electric field models have shown that the insulating layer does not significantly affect the electric field between the cathode and the anode. Since the first part does not contain lead, no significant insulating layer forms on it, but the electric field distribution prevents any significant portion of the discharges from being attracted to the surface of the second part. To the extent discharges do occur on the first part, erosion will occur at the discharge sites reducing the height of the anode in the region of the discharge which has the effect of reducing the discharge from the first part. About 50,000 small holes develop in the insulating layer on the second part which permit electrons to flow freely to and from the metal surface of the anode. However, fluorine ion sputtering on the metal surface of the anode is substantially limited after the insulating layer develops. Applicants believe that the reduction in fluorine ion sputtering results from a reduced number of fluorine ions reaching the metal surface and a reduction in energy of the ions that do reach the metal surface.

Applicants' tests have shown that a porous insulating layer that covers substantially all of the discharge surface of the anode does not significantly interfere with the electric field between the electrodes and does not significantly affect the shape of the discharge. (Adverse effects can result, however, if a substantial portion of the discharge region is covered and a substantial portion is not covered. In this case, the discharges tend to accumulate at the uncovered locations causing substantial erosion at those locations and severely distorting the uniformity of the discharge.) Thus, best performance results if the discharge surface is fully covered by the porous insulating layer or not covered by the layer at all. However, in the completely uncovered situation there is long term erosion whereas in the completely covered situation, we have very good performance and also minimum erosion over billions of pulses.

DETAILED DESCRIPTION OF PREFERRED EMBODIMENTS

Preferred embodiments of the present invention can be described by reference to the drawings.

Pulse Power Supply System

Figure 3:
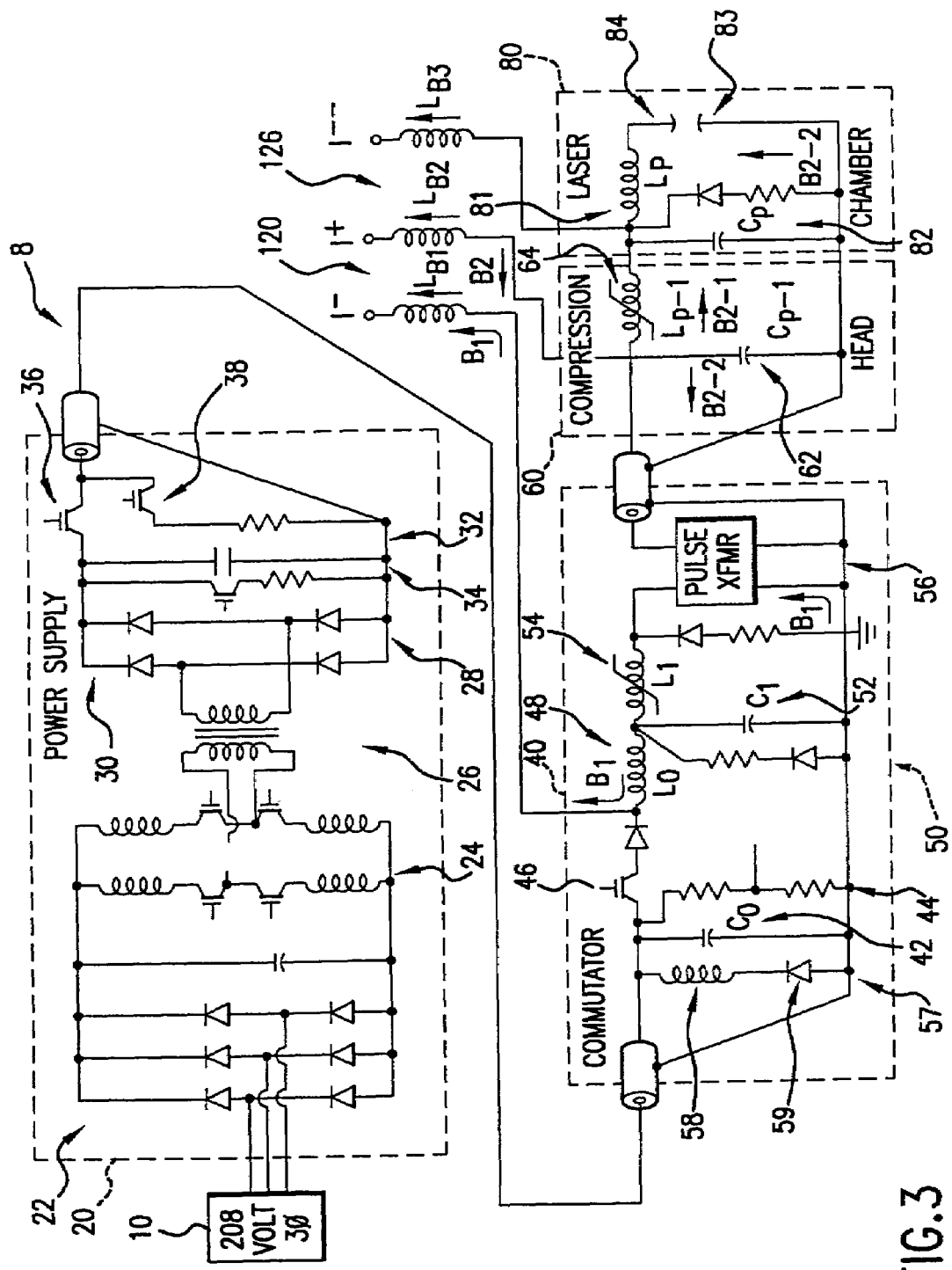
FIG. 3 shows the principal features of a pulse power system of a prior-art gas discharge laser.

The principal components of an electrical circuit 8 for providing pulse power to produce electrical discharges in a gas discharge laser are shown in FIG. 3. The pulse power system operates from a standard 208-volt, 3 phase electrical source. A power supply using rectifier 22, inverter 24, transformer 26 and rectifier 30 charges charging capacitor $C_o$ 42 to a voltage level between about 500 to 1200 volts as directed by a laser control processor (not shown). The laser control processor directs the closing of an IGBT switch 46 when a pulse is desired which causes the energy on $C_0$ to be discharged into the follow-on portions of the pulse power system. The charge on $C_0$ is transferred successively to capacitor bank $C_1$ 52 through inductor 48 then through saturable inductor 54 and through voltage transformer 56 to capacitor bank $C_{p-1}$ 62 and then through saturable inductor 64 to peaking capacitor bank $C_p$ 82. As shown in FIG. 3, peaking capacitor bank $C_p$ is connected electrically in parallel with electrodes 84 and 83.

Figure 4A:
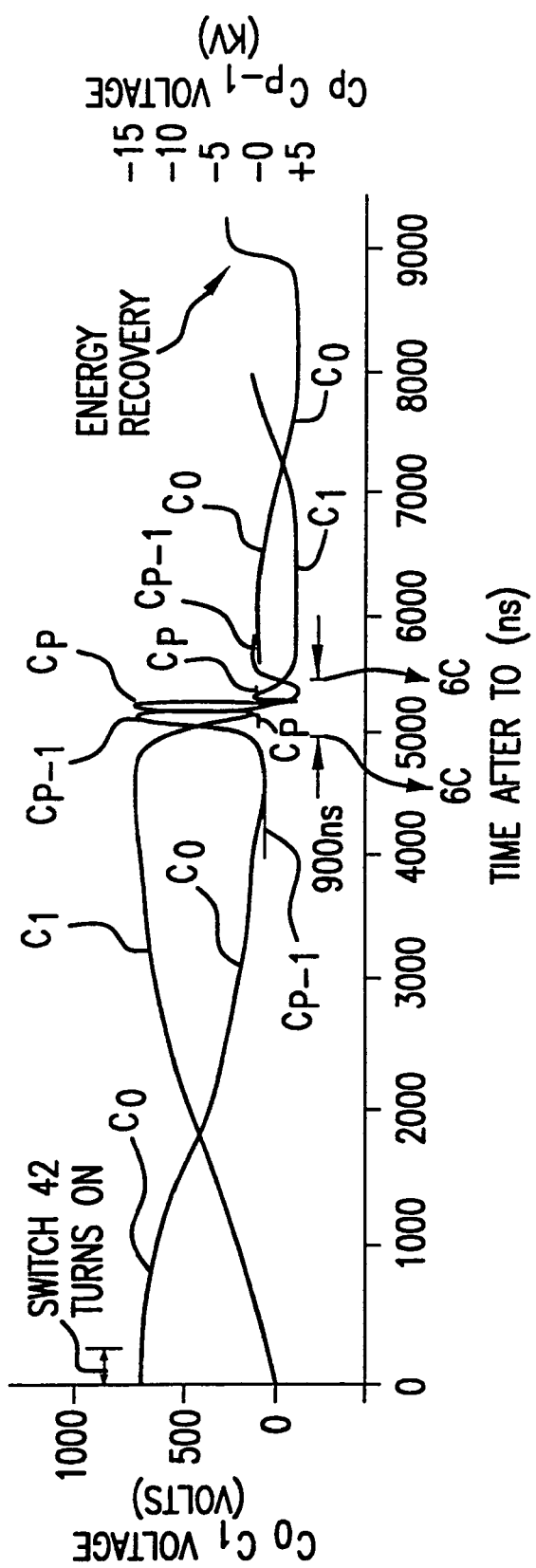
FIGS. 4A and 4B show electrical pulse shapes on the FIG. 3 pulse power system.
Figure 4B:
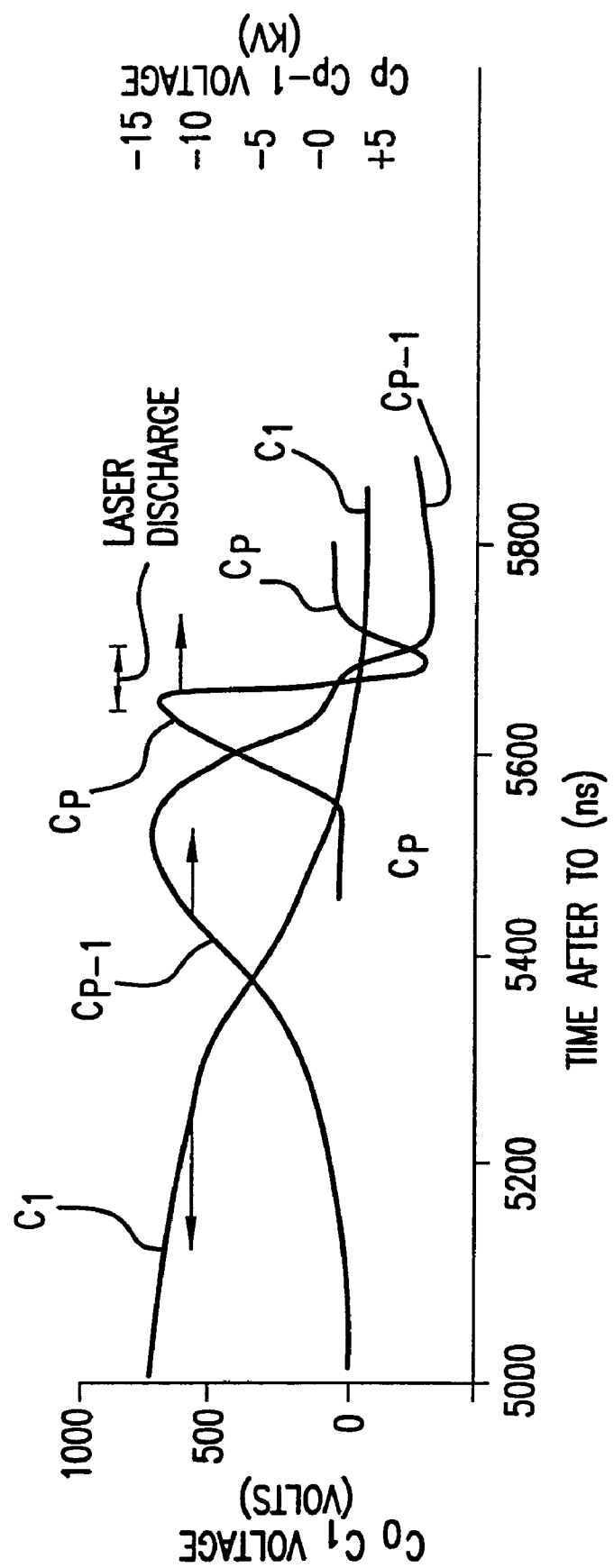

FIG. 4A shows the potential on capacitor banks $C_0$, $C_1$, $C_{p-1}$ and $C_p$ as a function of time beginning with the closing of switch 42 and for the following 9 microseconds. FIG. 4B shows an 800 ns time slice just before and after the discharge. The reader should note that the peaking capacitor bank $C_p$ is charged to approximately −15,000 V just prior to the discharge. The discharge lasts about 30 ns. During the discharge, the electron flow is first from the upper electrode, cathode 84 to the lower grounded electrode, anode 83. A current "overshoot" charges $C_p$ to a positive value of about +6,000 V at which time the downward flow of electrons is reversed after which the electron flow is from the lower grounded electrode to the upper electrode during the last approximately 15 ns of the discharge, all as shown in FIG. 4B.

New Electrode

Figure 1:
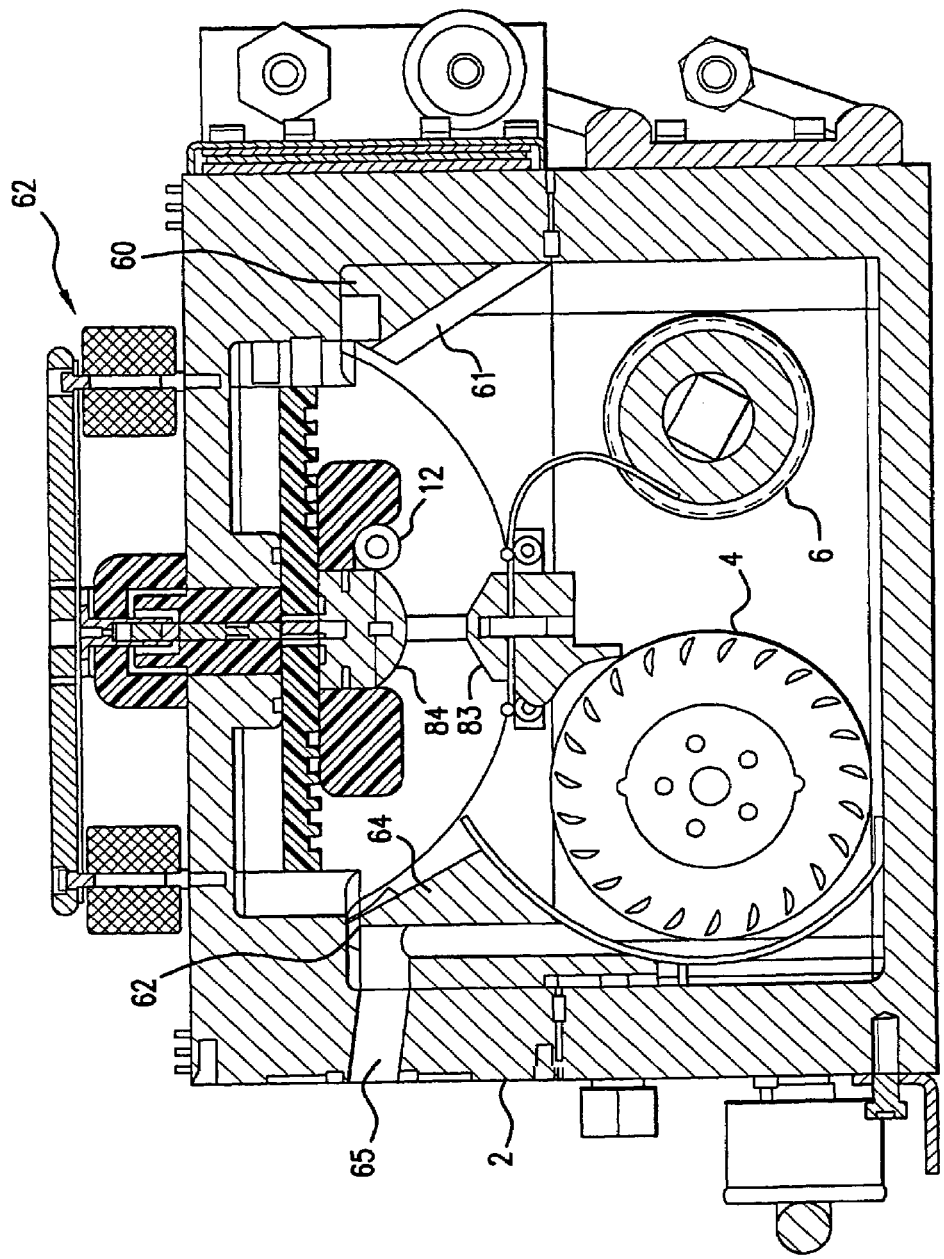
FIG. 1 shows a cross section of a chamber of a prior-art gas discharge laser.
Figure 2:
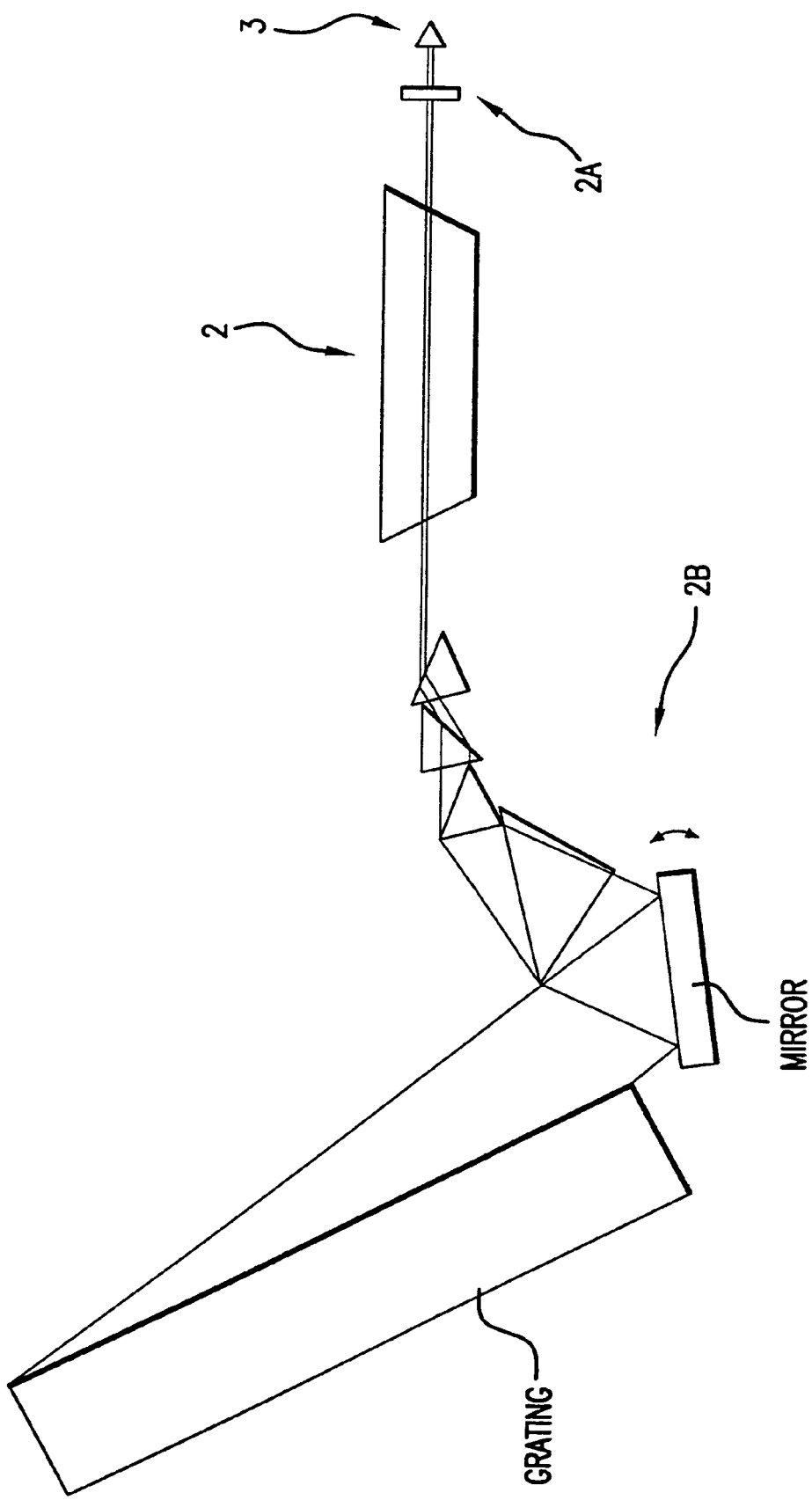
FIG. 2 shows other features of the prior art laser.

The surface of a newly fabricated prior art brass electrode of the type shown in FIG. 1 is very smooth. However, when viewed under a high power microscope the surface actually is comprised of longitudinal rows running the length of the electrode and spaced apart by about 1 to 2 microns with alternating ridges and valleys, with the bottom of the valleys being about 1 to 2 microns lower than the top of the ridges. The surface under the microscope appears as a long narrow plowed field resulting from machining operations.

Burnt-In Electrodes

The typical prior art practice when assembling a new laser system or rebuilding a laser chamber is to subject the chamber to a "burn in" phase in which the chamber is operated for about 500 million pulses. At 2000 Hz this requires about 72 hours. During this period, substantial sputtering occurs on the discharge surface of each electrode. The discharge surface is about 3.5 mm wide and about 545 mm long on each electrode. The sputtering occurring on the discharge surfaces of the electrodes and the discharges between the electrodes substantially alters the surface of the electrodes on the discharge portion of the surfaces. The "plowed rows" are no longer apparent after "burn-in" but are replaced mostly by relatively randomly spaced shallow blob indentations typically about 5 microns deep and about 3 to 10 microns wide. These blob-shaped indentations or craters are spaced close together (or slightly overlapping) on the cathode. They are typically somewhat farther apart on the anode so that there are about four times as many per area on the cathode as compared to the anode.

Erosion

Applicants have discovered that electrode erosion occurs on both electrodes but that the erosion rate of the grounded electrode (anode 83) is about four times that of the high negative voltage electrode (cathode 84). In almost all other gas discharge devices where electrode erosion is a problem, e.g., flashlamps, it is the cathode where most of the erosion occurs. Anode erosion is unusual. Laser operation with brass electrodes can result in an insulating layer of metal fluorides being built up very gradually on portions of the anode. Applicants have discovered that the extent of the fluoride buildup is related to the lead content of the brass anode. For example, an anode comprised of C26,000 brass having less than 1% lead does not produce a significant fluoride layer. However, an anode comprised of C36,000 brass with a 3 to 4% lead content produces a relatively uniform fluoride layer covering the entire discharge surface at a thickness of about 100 to 200 microns. In the regions covered by the fluoride layer, discharge current flows through tiny holes which typically tend to have approximately circular cross sections with diameters of about 20 to 150 microns. The surfaces covered by the fluoride layer do not suffer substantial further erosion, but if the fluoride layer is not uniform the erosion rate is increased on the non-covered discharge surfaces especially if the non-covered surface area decreases. There appears to be some erosion on the covered surfaces at the locations of the tiny holes, but this erosion is at least one, and possibly two orders of magnitude less than that of the base metal.

Sputtered Metal Ions

In order to create a good laser active media, a uniform discharge plasma must be created between the electrodes. Initially the gas in the gap between the electrodes is preionized with preionizer 12 shown in FIG. 1. As the voltage builds up on the electrodes ion sputtering produces plasma in the regions close to the electrode surfaces. Metal atoms sputtered from the electrodes are mostly in vapor form and a substantial portion of the metal atoms are ionized and help form a positive ion cathode "fall" region immediately adjacent to the surface of the cathode creating an extremely large electric field which contributes to the flow of electrons from the cathode and also accelerates electrons leaving the cathode. This process applies first to cathode 84 during the first portion of each pulse. However, because the polarity of the electrodes switch about half-way through the pulse, as shown in FIG. 4B, this effect also occurs at anode 83 which at that time functions as a cathode (i.e., the negative electrode). Both during and after the pulse the metal ions may be attracted back to the electrodes depending on the rapidly changing electric field conditions, but many are blown away by the circulating laser gas because some of the ejected electrode material is transported beyond the gas flow boundary layer. Applicants have discovered that substantial sputtering of copper from the anode is produced by negative fluorine ions during the first portion of each discharge when the anode is highly positively charged.

Fluoride Layer on Brass Electrode

Applicants have performed extensive testing of various electrode materials in attempts to improve electrode lifetime beyond 10 to 13 billion pulses. With brass electrodes, erosion at the discharge surface of the anode is normally the principal limit of electrode lifetime. Erosion changes the electrode shape from its optimum shape and as a consequence laser beam quality is adversely affected. Applicants' tests with these brass electrodes have shown that the longest lifetime is obtained when materials are used which produce uniform, stable fluoride layers on the discharge surface of the anode. In particular, in one example an anode comprised of C36,000 brass (61.5% copper, 35.5% zinc and 3% lead) produced 13 billion pulses with no degradation in laser performance. (A typical useful operating lifetime for these electrodes is about 5 to 6 billion pulses.) Examination of that anode after the 13 billion pulses revealed a fluoride layer about 100 microns thick covering all of the discharge surface except for about 2 cm long region. This uncovered region faced a portion of the cathode which was severely eroded. Applicants suspect that the erosion of the cathode in this severely eroded region created very high fields which produced very hot discharges which burned off the 2 cm missing section of the anode which lead to the end of life for the cathodes at 13 billion pulses. The fluoride layer is comprised mostly of lead fluoride but appears to contain other material from the anode including copper and zinc. Applicants' measurement of the electrical resistance of the layer confirms it is highly insulating, resistance measurements showing infinity with a hand held ohmmeter.

The insulating layer contains thousands of tiny holes with widths of from about 20 to 150 microns which bottom out on the metal surface of the anode. The holes are spaced at about 20 to 30 holes per square mm on the discharge surface of the anode. The total number of holes in the 3.5 mm×545 mm discharge surface was estimated by Applicants to be about 50,000, and the holes represent about 5% of the discharge surface area. The other 95% of the discharge area is comprised of an insulating, dielectric material that can repel negatively charged fluorine ions due to rapid accumulation of negative electronic surface charge.

Applicants have conducted tests with several other types of brass, such as for example C 26,000 brass (69.7% copper, 29.6% zinc and less than 0.7% lead) and has determined that the low lead brasses generally do not produce significant fluoride layers in the discharge region of the anode. Applicants' conclusion is that a lead concentration of greater than 1% is needed to produce stable fluoride layers on the anode. Copper and zinc form fluorides similar to lead fluorides and these copper fluorides and zinc fluorides have chemical properties very similar to lead fluoride, but these fluorides do not form a protective insulating layer as does the lead fluoride. Applicants suspect that the reason may be that the lead fluoride is much heavier than the copper and zinc fluoride and for this reason the lead fluoride may be better able to resist fluoride sputtering than copper or zinc fluoride.

First Preferred Embodiment

Figure 6:
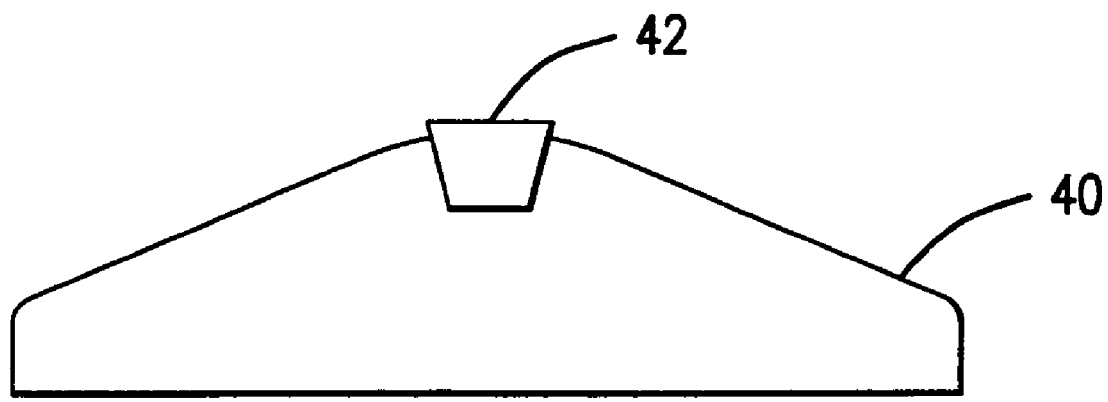
FIGS. 6, 7, 9, 10A and 12 show preferred anode cross sections.
Figure 5:
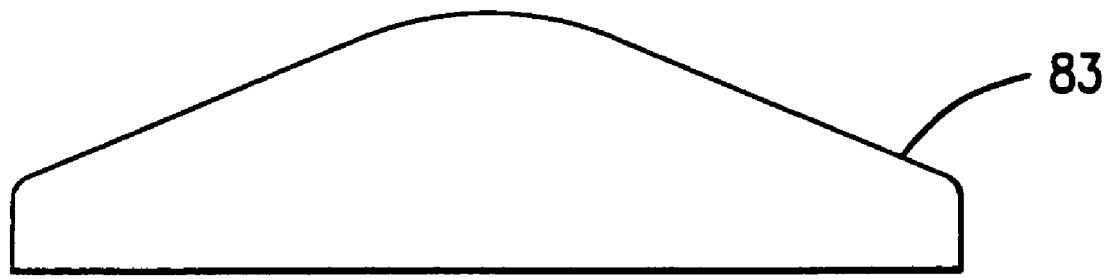
FIG. 5 is a cross section drawing of a prior art anode.

A first preferred embodiment of the present invention is a gas discharge laser such as KrF, ArF or $F_2$ having an elongated anode with the cross section shown in FIG. 6. The anode is comprised of two types of brass, the main body 40 of the anode 83 in C26000 brass which is 600 mm long. This anode is a modified version of a prior art anode which has been used extensively in these gas discharge lasers. The prior art anode 83 has a cross section as shown in FIG. 5. The width at the bottom is 1.2 inches. The height to the center tip is 0.380 inch. The tip has a radius of 0.5 inch. The shoulder height from the bottom surface is 0.13 inch. The slanted sides are flat planes at an angle of 27.67 degrees with the bottom surface. Applicants have proven with many laser-years of operation that this general anode shape produces excellent electric field properties and excellent discharge performance along with very good laser gas flow compatibility. A trench-shaped cavity is cut into the top surface of anode 83. The cavity is 545 mm long, 3 mm wide at the top, 2.5 mm deep and 1.7 mm wide at the bottom. The cavity is filled with a second brass part 42 which is cut to fit precisely in the cavity and extend above the surface by about 0.2 mm. The second brass part may be bonded in the cavity with Pb/Sn solder.

The anode is installed in a laser such as the one shown in FIG. 1 with, for example, a laser gas consisting of 1% krypton, 0.1% $F_2$ and the rest neon. A porous lead fluoride layer is created on the top surface of the second brass part by operation of the laser for about 500 million pulses. At 2000 pulse per second this requires about 3 days. This porous insulating layer which develops, retards erosion of the discharge surfaces which allows the anode to maintain this extremely good shape for may billions of discharges. Electrons flow easily through the approximately 50,000 small holes which develop in the lead fluoride layer. On the other hand, individual fluorine ions, which are far more massive than the electrons, have a low probability of passing through the holes to the underlying brass with sufficient energy to cause sputtering. Applicants estimate that the present invention will permit at least a doubling or tripling of anode life, so that anode erosion no longer limits laser chamber life. There is no insulating layer built up on the part 40 portion of the anode. Therefore, if the discharge were to extend to the part 40, the discharge would erode a trench at the edge of part 40 which would stop the discharge from that region. Therefore, discharges are limited to the part 42 portion of the anode.

Second Preferred Embodiment

Insulate the Anode Surface

Figure 7:
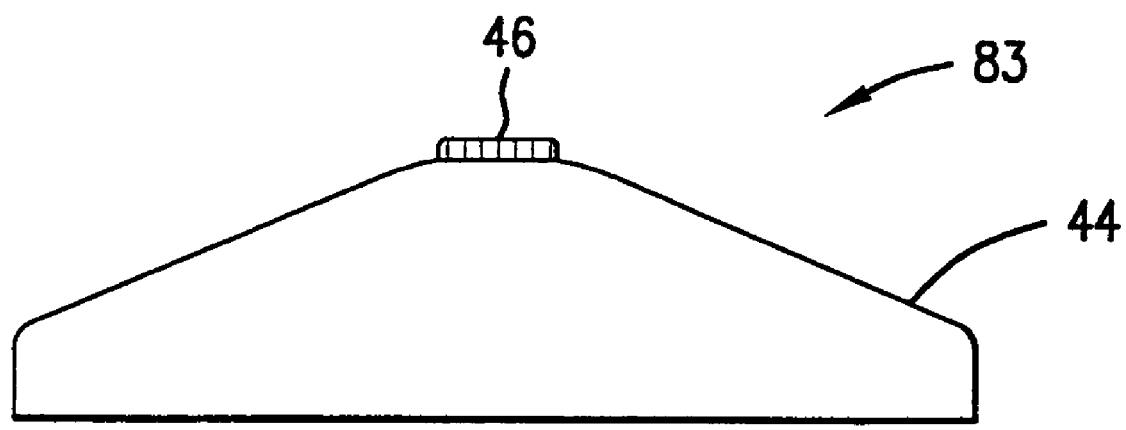

A cross section of an anode of a second preferred embodiment is shown in FIG. 7. Porous layer of insulating material 46 is placed over the discharge surface of a prior art anode. The brass forming the portion of the anode is C26000 brass which contains less than 1% lead. Therefore, no insulating layer will be created by any discharge that extends beyond the limit porous layer 60.

FIG. 8 shows a copy of microscopic photographs of a section of porous aluminum oxide. The porous oxide grows on aluminum in a process called anodization. High purity aluminum foil is mounted on the brass electrode. The brass electrode serves as an anode in an electrochemical cell. Generally, the purpose of the anodization is to produce a uniform protected alumina film on the anode. Using appropriate electrolytes and working voltage, the etching leads to production of the self organized porous structure as shown in FIG. 8. Holes with diameters from 10 to several hundred microns can be produced by varying the parameters of the anodization process. The thickness of the layer can be up to several hundred microns, but a thickness of about 100 to 1000 microns is preferred for the present application. This layer can be applied as layer 46 as shown in FIG. 7.

Third Preferred Embodiment

Figure 9:
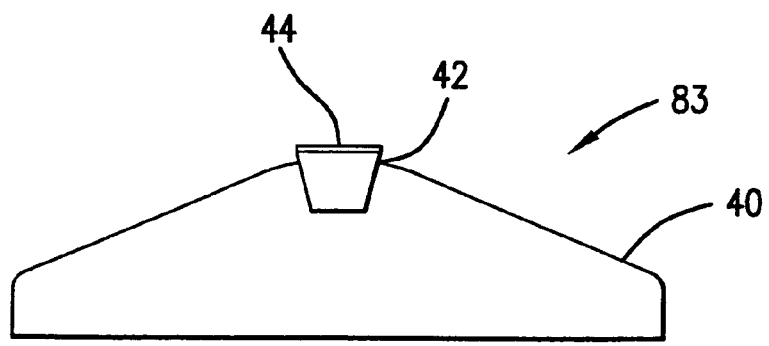

In a third preferred embodiment as shown in FIG. 9, the top surface of part 42 shown in FIG. 6 is coated with the porous alumina before part 42 is soldered into the cavity of part 40. In this embodiment, the C36000 brass will form a lead fluoride protective layer in a section if the porous alumina erodes away.

Fourth Preferred Embodiment

Tiny Insulating Particles

Figure 10A:
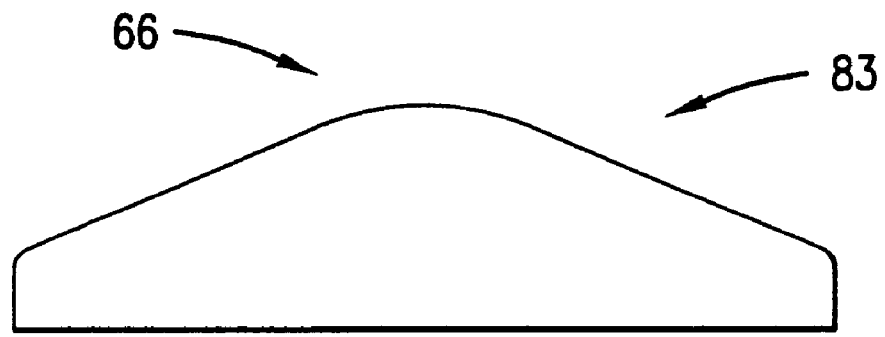
Figure 10B:
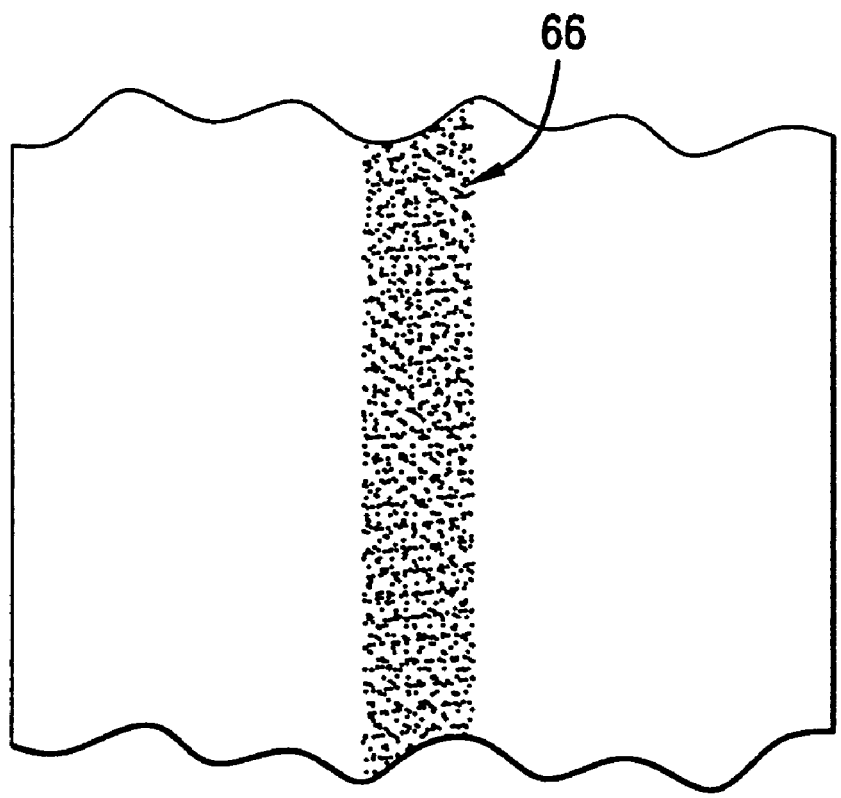
FIG. 10B is a top view of the FIG. 10A anode.

In a fourth preferred embodiment, tiny insulating particles 66 about the shape of grains of sand with dimensions of about 100 to 300 microns are braised to the discharge surface of a prior art brass electrode having the cross section shape shown in FIGS. 10A and 10B. In this embodiment, the discharge width is 3.5 mm. Preferably, the particles cover about 95% of the surface area of the cover about 95% of the surface area of the discharge surface as indicated in FIG. 10B which shows a top view of section of the anode.

Figure 8A:
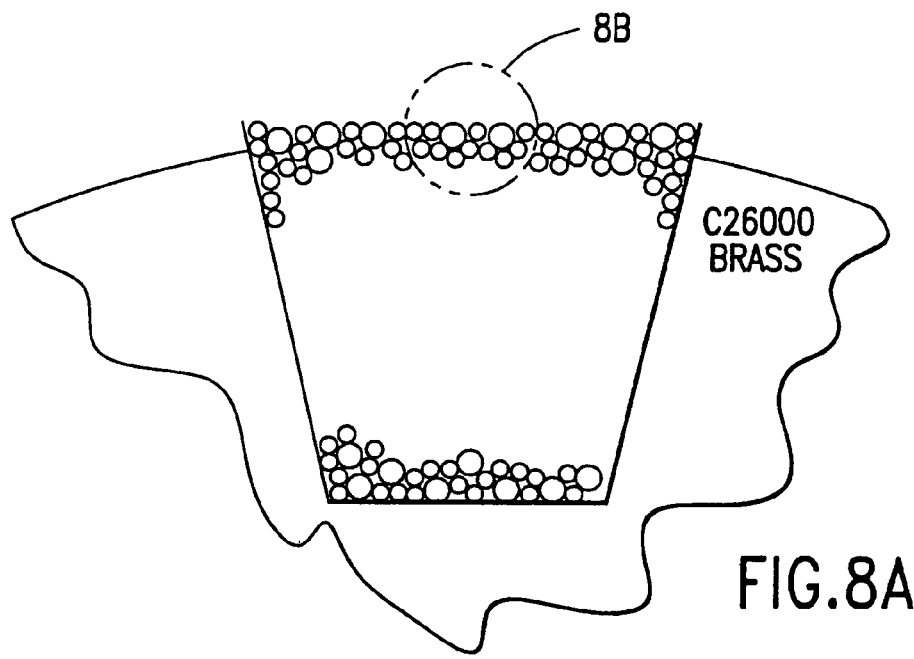
FIGS. 8A and 8B show a preferred embodiment of the present invention.
Figure 8B:
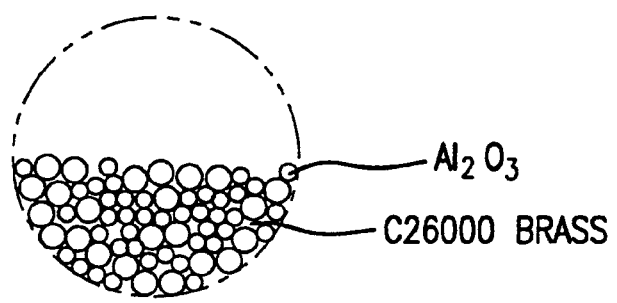

In a similar embodiment the tiny insulating particles are mixed with molten brass and the mixture are molded into the shape of part 42 as shown in FIG. 6. The resulting part is then machined to fit precisely into a part such as part 40 as shown in FIG. 6. Preferably, the particle sizes are 20 to 150 microns and the particle should constitute about 80–90 percent of the volume of the mixture. After a few days of operation, the surface brass will sputter away leaving an insulator layer on the surface but the material will continue to be conductive below the surface. FIGS. 8A and 8B are drawings showing the electrode surface after the surface brass has been sputtered away. The particles should be of a material which is stable at the melting point of brass and resistant to fluorine chemical reaction. Good choices are $Al_2O_3$, $CaF_2$ and $MgF_2$.

Other Embodiments

Full Surface Coverage

In another embodiment the porous alumina is applied over the entire top surface of a prior art brass electrode. In still another embodiment porous alumina is applied over the discharge region of a prior art brass electrode and a solid alumina layer is applied over the remainder of the top surface of the prior art brass electrode or alternately along the edges of the discharge region.

Blade Dielectric

Figure 12:
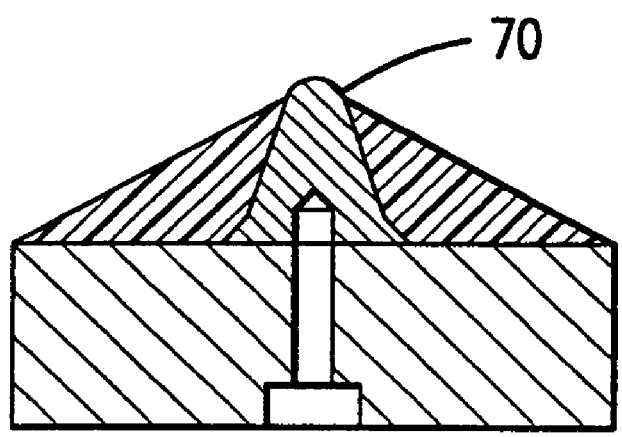

An alternate set of embodiments utilizing the principals of this invention is shown in FIG. 12. In this case the anode cross section has the shape of a very dull ax blade as shown at 70 in FIG. 12. It is sandwiched between two insulating dielectric flow spaces running the length (about 500 mm) of the anode. In accordance with the above description the blade electrode can be comprised of C36000 brass which will during operation in an $F_2$ laser gas environment develop a porous lead fluoride covering over the discharge surface of the anode. Alternatively, as indicated above the porous insulating coating such as porous alumina could be applied to the discharge surface of the blade shaped anode prior to its insertion in the laser chamber. Or as in the fourth preferred embodiment, insulating particles could be attached to the top surface of the blade shaped anode.

Current Return

Figure 11:
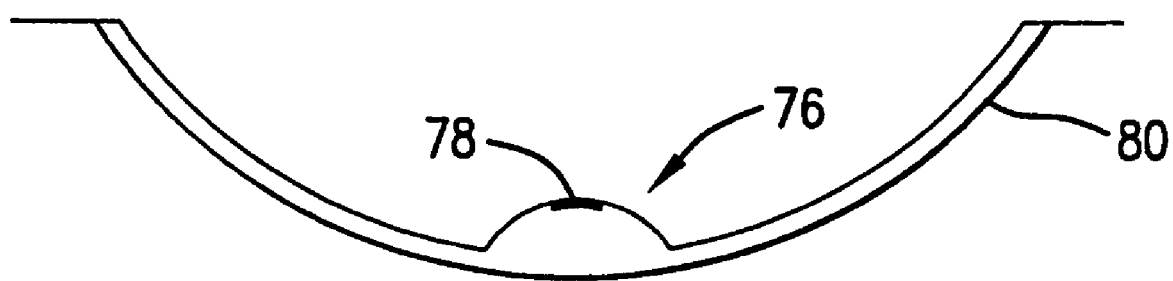
FIG. 11 shows a current return-anode unit.

In another preferred embodiment, the current return for the laser is fabricated into a shape as shown in FIG. 11. In this case, the center portion of the current return 76 has a cross section similar to the cross section of a prior art anode so as to produce a very high electric field along the center of the structure. This very high electric field is about 3.5 mm wide defining a discharge region about 3.5 mm wide and the field decreases very sharply on both sides of the discharge region. A porous insulating layer 78 is created covering the discharge region. This layer can be created using any of the techniques described above. This current return may be machined from brass. The discharge surface may be C36000. The preferred embodiment current return has about 40 whale-bone shaped structures 80 on both sides. The top of the current return bolts to the top of the chamber and the electrode portion may be bolted to a stiff electrode support.

Porous Coating for Cathode

Until now cathode erosion in these gas discharge lasers has not been considered a problem since the anodes have eroded at about four times the rate of the cathodes. With the problem of anode erosion solved, cathode erosion could become a life limiting problem. Therefore, in another preferred embodiment, in addition to the anode the cathode discharge region is also covered with a porous insulating material. The reader should understand that a lead fluoride layer will not develop naturally on the cathode because it repels negatively charged fluorine ions during the main portion of the discharge pulse time. However, a coated cathode could be produced in an $F_2$ environment with the cathode operating as an anode. Also, the other techniques described above for providing the porous insulating layer for the anode could be used to produce cathodes with porous insulating layers covering the discharge region. Those layers would protect the cathode from position ion bombardment in the same manner as the described anode protective layers shield it from negative fluorine ion bombardment.

While the invention has been described above with specificity in terms of preferred embodiments, the reader should understand and recognize that many changes and alterations could be made without deviating from the spirit of the invention. It is important to maintain good flow conditions in the gap between the electrodes to clear the gap of discharge debris prior to the next pulse. The width of the porous insulating layer should preferably correspond to the width of the discharge surface which preferably is about equal to the desired width of the laser beam or slightly larger than the beam width. The thickness of the insulating layer should preferably be between about 20 microns and 300 microns with a most preferred range of about 50 to 150 microns. However, the thickness of some of applicants' test anodes have ranged up to about 1 mm without causing serious problems. Two trenches could be provided along both edges of the porous insulating coating to minimize erosion at the edges of the insulating layer. The reader should understand that if the trenches are not provided they could develop naturally during operation of the laser due to erosion. The trenches could be filled partially or fully with insulating material. Therefore, the scope of the invention should be determined by the appended claims and their legal equivalents.

We claim:

1. A method of operating a gas discharge laser comprising:
    utilizing a laser chamber containing a laser gas, providing two elongated electrode elements defining a cathode and an anode, each electrode having a gas discharge region, said electrodes being disposed within said laser chamber and said gas discharge region of said anode being covered with a porous insulating layer, having a porosity sufficient to effectively permit electrons to flow freely to and from the metal surface of said anode while effectively limiting substantial laser-gas-constituent ion interaction with said anode,
    utilizing a pulse power system to provide electrical pulses at rates in excess of 1000 pulses per second to produce electric discharges, said electric discharges occurring in said gas discharge regions on said anode and on said cathode and producing a laser gas discharge intermediate said two electrodes,
    circulating said laser gas between said two electrodes sufficiently to remove substantially all debris produced by a laser gas discharge prior to a next subsequent laser gas discharge when operating at pulse rates in excess of 1000 pulses per second, and
    using a heat exchanger to remove heat from said last gas produced by said blower system and said discharge.

2. A The method as in claim 1 wherein said porous insulating layer is comprised of a metal fluoride.

3. A The method as in claim 1 further comprising creating said insulating layer by exposing said anode to electric discharges in a gas environment wherein gas in said gas environment comprises fluorine.

4. The method as in claim 1 wherein said porous insulating layer comprises a porous alumina layer.

5. The method as in claim 1 wherein said porous alumina layer is an anodized alumina layer.

6. The method as in claim 1 where said porous insulating layer is comprised of particles comprised of an electrical insulator material.

7. The method as in claim 6 wherein said insulator material is a ceramic.

8. The method as in claim 6 wherein said insulator material is a fluoride.

9. The method as in claim 6 wherein said insulator material consists of a ceramic chosen from a group consisting of $Al_2O_3$, $MgF_2$ and $CaF_2$.

10. The method as in claim 1 wherein said porous insulating layer is comprised of a large number of holes.

11. The method as in claim 10 wherein said large number of holes is in excess of 50,000.

12. The method as in claim 10 wherein most of said large number of holes have widths of between 20 microns and 250 microns.

13. The method as in claim 1 wherein said anode has a cross section chosen to produce a high electric field over a width, defining the discharge region of said anode, of about 3.5 mm along a centerline of said anode, with a sharp decrease in the electric field on both sides of said anode discharge region.

14. The method as in claim 1 wherein at least one of said electrode elements define a discharge surface and comprises trenches running longitudinally along two sides of said discharge surface.

15. The method as in claim 14 wherein said trenches are at least partially filled with insulator material.

16. The method as in claim 15 wherein said insulator material is chosen from a group consisting of alumina and metal fluorides.

17. The method as in claim 1 wherein at least one of said electrode elements is comprised of a first non-insulating material having high electrical conductance defining a high conductance and a second non-insulating material having a conductance, defining a lower conductance of less than 70 percent of the high conductance, said first non-insulating material defining a discharge surface.

18. The method as in claim 17 wherein said material having the lower conductance comprises a lossey electrode material.

19. The method as in claim 1 wherein said anode comprises insulating sheets disposed on two sides of said discharge surface.

20. The method as in claim 1 and further comprising utilizing a current return structure to shape the discharge to a desired shape and further comprising utilizing insulating spacers to guide the gas flow through and beyond the discharge region.

21. The method as in claim 1 wherein said porous insulating layer is comprised of insulating particles embedded in a metal.

22. The method as in claim 21 wherein said metal is brass.

23. A process for producing an elongated electrode for use in a laser comprising the steps of:

fabricating an elongated electrode structure comprised of one or more electrical conducting materials and having a long dimension of at least 50 centimeters and a width of at least 2 centimeters;

creating a porous insulating layer on a portion of said elongated electrode, said portion defining a discharge region having a width of at least 3 millimeters said porous insulating layer having a porosity sufficient to effectively permit electrons to flow freely to and from the metal surface of said anode while effectively limiting substantial laser-gas-constituent ion interaction with said anode.

24. The process as in claim 23 wherein said one or more electrical conducting materials comprise a lead rich brass having a lead content of greater than 1 percent, and said step of creating said porous electrical insulating layer comprises operating said electrode in a fluorine containing laser gas to permit a porous insulating layer to build up on the lead rich brass.

25. The process as in claim 23 wherein said step of creating said porous insulating layer comprises spreading insulating particles on the discharge region of said elongated electrode structure.

26. The process as in claim 23 wherein said step of creating said porous insulating layer comprises the steps of:

mixing insulating particles in a molten metal to produce a discharge section of said elongated electrode said section comprising a filler metal and said insulating particles, operating said elongated electrode in a fluorine containing laser gas environment to permit a portion of said filler metal to sputter away leaving a porous insulating layer covering said discharge region.

27. The process as in claim 25 wherein said insulating particles have dimensions in the range of about 50 to 150 microns.

28. The process as in claim 26 wherein said particles have dimensions in the range of about 50 to 150 microns.

* * * * *